United States Patent [19]
West et al.

[11] Patent Number: 5,888,700
[45] Date of Patent: Mar. 30, 1999

[54] LITHOGRAPHIC PRINTING PLATES HAVING A PHOTOPOLYMERIZABLE IMAGING LAYER OVERCOATED WITH AN OXYGEN BARRIER LAYER

[75] Inventors: Paul Richard West, Fort Collins; Jeffery Allen Gurney, Greeley, both of Colo.

[73] Assignee: Kodak Polychrome Grpahics, LLC, Norwalk, Conn.

[21] Appl. No.: 5,859

[22] Filed: Jan. 12, 1998

Related U.S. Application Data

[62] Division of Ser. No. 615,916, Mar. 14, 1996, Pat. No. 5,821,030.

[60] Provisional application No. 60/001,267, Jul. 20, 1995.

[51] Int. Cl.⁶ .................................................. G03F 7/26
[52] U.S. Cl. .............................. 430/302; 430/945
[58] Field of Search ...................... 430/302, 945

[56] References Cited

U.S. PATENT DOCUMENTS

| | | | |
|---|---|---|---|
| 3,615,629 | 10/1971 | Wilhelm et al. | 430/288.1 |
| 3,753,715 | 8/1973 | Klüpfel et al. | 430/273.1 X |
| 4,095,019 | 6/1978 | Markiewitz et al. | 526/215 |
| 4,278,751 | 7/1981 | Specht et al. | 430/281.1 |
| 4,469,775 | 9/1984 | Lynch et al. | 430/273.1 |
| 4,511,646 | 4/1985 | Fohrenkamm et al. | 430/302 X |
| 4,868,092 | 9/1989 | Kawabata et al. | 430/281.1 |
| 4,921,827 | 5/1990 | Ali et al. | 502/167 |
| 4,939,069 | 7/1990 | Kawabata et al. | 430/281.1 |
| 4,942,111 | 7/1990 | Wade et al. | 430/961 X |
| 4,946,758 | 8/1990 | Kurtz et al. | 430/961 X |
| 4,965,171 | 10/1990 | Kawabata et al. | 430/288.1 |
| 4,988,607 | 1/1991 | Ali | 430/961 X |
| 5,153,236 | 10/1992 | Kaji et al. | 522/14 |
| 5,273,862 | 12/1993 | Zertani et al. | 430/271.1 |
| 5,322,762 | 6/1994 | Kushi et al. | 430/945 X |
| 5,597,677 | 1/1997 | Kangas et al. | 430/302 |
| 5,677,110 | 10/1997 | Chia et al. | 430/302 |

FOREIGN PATENT DOCUMENTS

| | | |
|---|---|---|
| 0 290 133 | 11/1988 | European Pat. Off. |
| 0 552 578 | 1/1993 | European Pat. Off. |
| 1660964 | 9/1991 | Japan |
| 7-28251 | 1/1995 | Japan |
| 7-43905 | 2/1995 | Japan |

OTHER PUBLICATIONS

Fouassier et al, Journal of Imaging Science and Technology, vol. 37, No. 2, Mar./Apr., 1993, pp. 208–210.
Marino et al, Proceedings of the Radtech '94 Conference, vol. 1, pp. 169–179, May 1, 1994.
Yamaoka et al, Journal of Applied Polymer Science, vol. 38, 1271–1285 (1989).
Mibuka et al, 07–43905, Feb. 14, 1995, English Abstract of Japanese Patent Application 07–43905, Patent Abstracts of Japan on Automated Patent System of PTO.
Mibuka et al, 95–119556, English Abstract of Japanese Patent Application 07–43905, published Feb. 14, 1995 on File WPIDS, Derwent Information Ltd.
Mibuka et al, 07–28251, Jan. 31, 1995, English Abstract of Japanese Patent Application 07–28251 published Jan. 31, 1995, Patent Abstracts of Japan on Automated Patent System of PTO.
Mibuta et al, 95–102691, English Abstract of Japanese Patent Application 07–28251, published Jan. 31, 1995, on File WPIDS, Derwent Information Ltd.

*Primary Examiner*—Cynthia Hamilton
*Attorney, Agent, or Firm*—Ratner & Prestia

[57] ABSTRACT

Improved lithographic printing plates adapted to be imagewise-exposed with ultraviolet- or visible-light-emitting lasers such as argon-ion lasers and frequency doubled Nd:YAG lasers, are comprised of a radiation-sensitive layer and an oxygen barrier layer. The radiation-sensitive layer includes one or more addition-polymerizable ethylenically-unsaturated compounds and a photopolymerization initiator system comprised of a spectral sensitizer that sensitizes in the ultraviolet or visible regions of the spectrum and an N-aryl, O-aryl or S-aryl polycarboxylic acid co-initiator; the oxygen barrier layer comprises fully hydrolyzed polyvinyl alcohol; and a basic compound is incorporated in the oxygen barrier layer or the radiation-sensitive layer or both in an amount sufficient to control thermal fog susceptibility of the lithographic printing plate. Such plates are able to effectively meet the requirements of very high photospeed, freedom from thermal fog and very good shelf-life required in computer-to-plate systems.

18 Claims, No Drawings

LITHOGRAPHIC PRINTING PLATES HAVING A PHOTOPOLYMERIZABLE IMAGING LAYER OVERCOATED WITH AN OXYGEN BARRIER LAYER

CROSS REFERENCE TO RELATED APPLICATION

Reference is made to and priority claimed from U.S. Provisional Application Ser. No. 60/001267 filed Jul. 20, 1995, and a division of U.S. patent application Ser. No. 08/615,916 fired Mar. 14, 1996 now U.S. Pat. No. 5,821,030.

CROSS-REFERENCE TO RELATED APPLICATIONS

Copending commonly-assigned U.S. patent application Ser. No. 395,352, filed Feb. 28, 1995, "Sensitized Photopolymerizable Compositions And Use Thereof In Lithographic Printing Plates" by Paul R. West and Jeffery A. Gurney describes a photopolymerizable composition comprised of:
  (1) at least one addition-polymerizable ethylenically-unsaturated compound, and
  (2) a photopolymerization initiator system comprising:
    (A) a spectral sensitizer that sensitizes in the ultraviolet or visible regions of the spectrum, and
    (B) a polycarboxylic acid comprising an aromatic moiety substituted with a hetero atom selected from nitrogen, oxygen and sulfur and comprising at least two carboxyl groups with at least one of the carboxyl groups being linked to the hetero atom.

FIELD OF THE INVENTION

This invention relates in general to lithographic printing plates and in particular to lithographic printing plates of the type which are suitable for direct digital exposure. More specifically, this invention relates to novel lithographic printing plates which comprise a photopolymerizable imaging layer overcoated with an oxygen barrier layer and which can be imagewise exposed with ultraviolet- or visible-light-emitting lasers.

BACKGROUND OF THE INVENTION

It is well known in the art relating to the manufacture of lithographic printing plates to utilize a photopolymerizable composition as the image-forming layer. Typical photopolymerizable compositions for this purpose comprise one or more addition-polymerizable ethylenically-unsaturated compounds and a photopolymerization initiator system. The addition-polymerizable compounds can be monomers, oligomers or polymers, or mixtures thereof, and frequently the photopolymerizable composition will also include a film-forming polymeric binder.

Photopolymerizable compositions of the type which are suitable for direct digital exposure are of increasing importance to the printing industry. Such compositions find particular utility in so-called "direct-to-plate" or "computer-to-plate" systems which utilize image setters. Practical considerations have resulted in visible-light-emitting lasers, such as low power argon-ion lasers, being preferred for use with plate-capable image setters. The need for high writing speeds, coupled with the constraint of the low-powered lasers favored in the industry, has resulted in a requirement for printing plates that have very high photosensitivities. However, high photosensitivity alone is not enough as it is essential that the photopolymerizable composition also have good shelf-life.

In an effort to meet the dual objectives of high photosensitivity and good shelf-life, the prior art has proposed the use of a wide variety of different photopolymerization initiator systems, but has not been fully successful in simultaneously meeting the dual objectives. Among the most effective prior art photopolymerization initiator systems are those which comprise a spectral sensitizing dye and an N-aryl-α-amino acid, such as N-phenylglycine (NPG) or a derivative thereof, as a co-initiator. Thus, for example, U.S. Pat. No. 4,278,751 describes an initiator system comprising NPG and an amine-substituted ketocoumarin; U.S. Pat. Nos. 4,868,092 and 4,965,171 describe an initiator system in which the spectral sensitizing dye is a xanthene, coumarin or merocyanine and which includes both NPG, or certain derivatives thereof, and a diaryliodonium salt; and U.S. Pat. No. 5,153,236 describes an initiator system which includes an N-aryl-α-amino acid, such as NPG, and in which the spectral sensitizing dye is a thioxanthone, an isoalloxanine or a coumarin. Photopolymerizable compositions containing an initiator system comprising a coumarin, an iodonium salt and NPG are also described in J. P. Fouassier et al, "A New Three-Component System In Visible Laser Light Photo-Induced Polymerization", Journal Of Imaging Science And Technology, Vol. 37, No. 2, March/April, 1993.

In addition to the use of N-aryl-α-amino acids as co-initiators, it is also known to employ O-aryl and S-aryl compounds as described for example, in U.S. Pat. No. 4,939,069, issued Jul. 3, 1990.

Photoinitiating systems of the bimolecular type consisting of a radical generator and a sensitizing dye and mechanisms whereby they are believed to function are described in Yamaoka et al, "N-Phenylglycine-(Thio)xanthene Dye Photoinitiating System and Application to Photopolymer for Visible Laser Exposure", Journal of Applied Polymer Science, Vol. 38, 1271–1285 (1989). As pointed out by Yamaoka et al, bimolecular type photoinitiators consisting of N-phenylglycine and a xanthene or thioxanthene dye exhibit high initiating efficiency. However, such systems are deficient in regard to shelf-life.

Fluorone dyes are shown to work well as visible light photoinitiators in combination with NPG and iodonium salts in an article by Thomas L. Marino et al, entitled "Chemistry And Properties Of Novel Fluorone Visible Light Photoinitiators" published in the Proceedings of the Radtech '94 Conference, Vol. 1 page 1691, 1994 by Radtech International North America. The fluorone dyes described provide panchromatic absorption throughout the visible spectrum.

Use of NPG as a co-initiator in a photopolymerization initiator system provides excellent photospeed, but the composition tends to rapidly lose photospeed on aging, i.e., its shelf-life is poor. Thus, for example, D. F. Eaton has noted that the improvements in photosensitivity provided by amine activators in general and by NPG in particular are lost within days of preparation of photosensitive films containing such materials. See "Dye Sensitized Photopolymerization" by D. F. Eaton in Advances In Photochemistry, Vol. 13, D. Volman, K. Gollnick and G. S. Hammond, eds., Wiley Interscience (1986).

European Patent Application No. 0 522 568, published Jan. 13, 1993, describes a photopolymerizable composition in which the NPG co-initiator has been derivatized with a compound such as glycidyl methacrylate in an effort to improve shelf-life. Such use of glycidyl methacrylate is, however, highly undesirable from an environmental standpoint, because of concerns relating to toxicity, and improvement in shelf-life is marginal at best.

Additional references relating to the use of iodonium salts in photopolymerizable compositions include Japanese Patent No. 1,660,964 (Patent Application No. 58-198085, filed Oct. 21, 1983, KOKAI No. 60-88005, published May 17, 1985, KOKOKU No. 3-62162, published Sep. 25, 1991) which describes a photopolymerization initiator system comprising a 3-ketocoumarin and a diaryl iodonium salt; U.S. Pat. No. No. 4,921,827, issued May 1, 1990, which describes a photopolymerization initiator system comprising at least one merocyanine sensitizer containing a constrained alkylamino group and an initiator selected from the group consisting of photosensitive iodonium salts, sulfonium salts and halomethyl s-triazines; and European Patent Application No. 0 290 133 which describes a photopolymerization initiator system comprising an aryliodonium salt, a sensitizer and an electron donor having an oxidation potential that is greater than zero and less than or equal to that of p-dimethoxybenzene.

A particularly advantageous photopolymerizable composition which meets the needs of the art for both high sensitivity and good shelf life is described in copending commonly assigned U.S. patent application Ser. No. 395,352, filed Feb. 28, 1995, "Sensitized Photopolymerizable Compositions And Use Thereof In Lithographic Printing Plates" by Paul R. West and Jeffery A. Gurney. As described in this patent application, the improved photopolymerizable composition is comprised of:

(1) at least one addition-polymerizable ethylenically-unsaturated compound, and (2) a photopolymerization initiator system comprising:
   (A) a spectral sensitizer that sensitizes in the ultraviolet or visible regions of the spectrum, and
   (B) a polycarboxylic acid comprising an aromatic moiety substituted with a hetero atom selected from nitrogen, oxygen and sulfur and comprising at least two carboxyl groups with at least one of the carboxyl groups being linked to the hetero atom.

In addition to the spectral sensitizer and the polycarboxylic acid co-initiator, it is preferred to include in the photopolymerization initiator system of U.S. patent application Ser. No. 395,352 a second co-initiator selected from the group consisting of (1) iodonium salts, (2) titanocenes, (3) haloalkyl-substituted s-triazines, (4) hexaaryl bisimidazoles, (5) photooxidants containing a heterocyclic nitrogen atom that is substituted by either an alkoxy group or an acyloxy group such as, for example, the N-alkoxypyridinium-salts, and (6) alkyltriarylborate salts.

As also described in the aforesaid patent application, the photopolymerizable imaging layer is preferably overcoated with an oxygen barrier layer in order to realize maximum photosensitivity and particularly good results are obtained with oxygen barrier layers composed of polyvinyl alcohol. Use of polyvinyl alcohols which are fully hydrolyzed, for example 98% hydrolyzed, is preferred, in particular because of the improved adhesion of the oxygen barrier layer to the underlying photopolymerizable imaging layer that is achieved. It is believed that the need for fully hydrolyzed polyvinyl alcohol in the oxygen barrier layer to obtain good adhesion is dictated by the presence in the photopolymerizable layer of ionic or zwitterionic materials such as alkoxypyridinium salts, iodonium salts and/or N-aryl, O-aryl or S-aryl polycarboxylic acids. While the use of fully hydrolyzed polyvinyl alcohol effectively avoids the adhesion problem, it results in greatly increased susceptibility to thermal fogging. In particular, the lithographic printing plate has a tendency to incompletely develop in the non-exposed areas if exposed to high temperatures. Such exposure to high temperatures can occur, for example, during storage of the plate. Use of a less than fully hydrolyzed polyvinyl alcohol, for example use of 88% hydrolyzed polyvinyl alcohol, avoids the thermal fogging problem but results in poor adhesion.

It is toward the objective of providing an improved lithographic printing plate which overcomes both the problem of poor adhesion and the problem of thermal fogging that the present invention is directed.

SUMMARY OF THE INVENTION

In accordance with this invention, an improved lithographic printing plate is comprised of a support having thereon (I) a radiation-sensitive layer and (II) an oxygen barrier layer; wherein the radiation-sensitive layer is comprised of:

(1) at least one addition-polymerizable ethylenically-unsaturated compound, and (2) a photopolymerization initiator system comprising:
   (A) a spectral sensitizer that sensitizes in the ultraviolet or visible regions of the spectrum, and
   (B) a polycarboxylic acid comprising an aromatic moiety substituted with a hetero atom selected from nitrogen, oxygen and sulfur and comprising at least two carboxyl groups with at least one of the carboxyl groups being linked to the hetero atom; the oxygen barrier layer is comprised of fully hydrolyzed polyvinyl alcohol; and the lithographic printing plate comprises a basic compound, in at least one of the oxygen barrier layer and the radiation-sensitive layer, in an amount sufficient to reduce thermal fog susceptibility of the lithographic printing plate.

The polycarboxylic acids utilized in this invention as co-initiators comprise an aromatic moiety. By the term "aromatic moiety", as used herein, is meant a mono- or polynuclear hydrocarbon radical, such as a benzene, biphenyl, naphthalene or anthracene group. The aromatic moiety is substituted with a nitrogen, oxygen or sulfur atom so that the compounds can be referred to as N-aryl, O-aryl or S-aryl polycarboxylic acids. In addition to being substituted with a nitrogen, oxygen or sulfur atom, the aromatic moiety can optionally include one or more additional substituents.

The N-aryl polycarboxylic acids comprise an N-aryl nucleus which can be represented by the formula:

wherein Ar is a substituted or unsubstituted aryl group. Similarily, the O-aryl polycarboxylic acids comprise an O-aryl nucleus which can be represented by the formula:

and the S-aryl polycarboxylic acids comprise an S-aryl nucleus which can be represented by the formula:

The polycarboxylic acids utilized in this invention include within their structure at least two carboxyl groups with at least one of the carboxyl groups being linked to the hetero atom. Thus, the O-aryl and S-aryl polycarboxylic acids have a carboxyl group linked to the oxygen or sulfur atom, respectively, and one or more carboxyl groups linked to the Ar group.

The N-aryl polycarboxylic acids can have one carboxyl group linked to the nitrogen atom and one or more carboxyl groups linked to the Ar group, or they can have two carboxyl groups linked to the nitrogen atom and no carboxyl groups linked to the Ar group, or they can have two carboxyl groups linked to the nitrogen atom and one or more carboxyl groups linked to the Ar group. When the nitrogen atom is substituted with only one carboxyl group, the other substituent on the nitrogen atom can be hydrogen or a monovalent organic radical such as an alkyl group.

Whether they are N-aryl, O-aryl or S-aryl compounds, the co-initiators of this invention are polycarboxylic acids. By contrast, the N-aryl-α-amino carboxylic acids, such as NPG, which have heretofore been utilized as co-initiators are monocarboxylic acids.

In the present invention, it is preferred that the heteroatom be a nitrogen atom and, accordingly, that the polycarboxylic acid be an N-aryl polycarboxylic acid and particularly preferred to utilize an N-aryl polycarboxylic acid in which at least one carboxyl group is linked to the nitrogen atom of the N-aryl nucleus by means of a methylene (—CH$_2$—) linking group.

In one preferred embodiment of the invention, the co-initiator is a polycarboxylic acid of the formula:

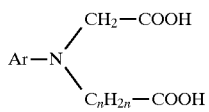

wherein Ar is a substituted or unsubstituted aryl group and n is an integer with a value of from 1 to 5.

In a second preferred embodiment of the invention, the co-initiator is a polycarboxylic acid of the formula:

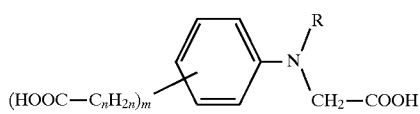

wherein n is an integer with a value of from 1 to 5, m is an integer with a value of from 1 to 5, and R is hydrogen or an alkyl group of 1 to 6 carbon atoms.

In a third preferred embodiment of the invention, the co-initiator is a dicarboxylic acid of the formula:

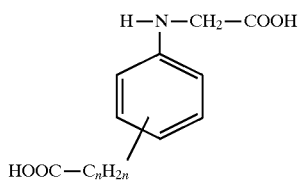

wherein n is an integer with a value of from 1 to 5.

In a fourth preferred embodiment of the invention, the co-initiator is a diacetic acid of the formula:

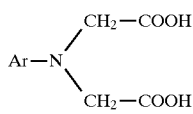

wherein Ar is a substituted or unsubstituted aryl group.

In a fifth preferred embodiment of the invention, the co-initiator is a diacetic acid of the formula:

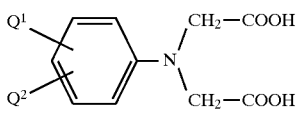

wherein Q$^1$ and Q$^2$ are independently hydrogen, alkyl, alkoxy, thioalkyl, aryl, aryloxy or halogen.

In the most preferred embodiment of the invention, the co-initiator is anilinediacetic acid which has the formula:

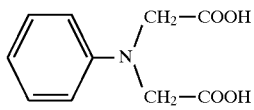

This compound can also be referred to as N-phenyliminodiacetic acid or as N-(carboxymethyl)-N-phenylacetic acid.

The term "photopolymerization" is used herein in a broad sense to include photocrosslinking and photodimerization of macromolecules as well as to describe the photoinduced initiation of vinyl polymerization. Thus, the photopolymerizable compositions in which the novel photopolymerization initiator system described herein is useful can vary widely in composition and properties.

As hereinabove described, it is well known in the art to use the compound N-phenylglycine (NPG) which has the formula:

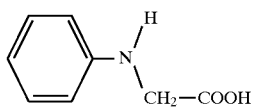

as a co-initiator in a photopolymerization initiator system comprising a spectral sensitizer that sensitizes in the ultraviolet or visible regions of the spectrum. However, the co-initiators described herein are much more effective than N-phenylglycine in meeting the dual objectives of high photosensitivity and good shelf-life.

N-aryl-α-amino carboxylic acids, such as NPG, which have heretofore been proposed for use as co-initiators in photopolymerization initiator systems are monocarboxylic acids. In marked contrast, the co-initiators described herein are polycarboxylic acids which comprise two or more carboxyl groups. The presence of the additional carboxyl substitution has been found, most unexpectedly, to contribute greatly to meeting the dual requirements of high photo-speed and good shelf-life. While applicants do not intend to be bound by any theoretical explanation of the manner in which their invention functions, it is believed that the improved performance may be related to the ability of the polycarboxylic acid co-initiator to resist thermal decarboxylation.

The incorporation of an effective amount of a basic compound in either or both of the oxygen barrier layer and the radiation-sensitive layer has been unexpectedly found to provide a highly effective solution to the problem of thermal fogging. Susceptibility to thermal fogging is a problem for several reasons. Obviously, the shelf-life of a printing plate with such properties becomes dependent upon storage temperature. Through-put of coating equipment used to produce the plate is constrained by having to use lower drying temperatures. Finally, plates based upon photopolymerization technology frequently require post-exposure heating for optimal performance. Susceptibility to thermal fogging limits the temperature latitude of such post-exposure baking steps.

The polyvinyl alcohol layer which serves as an oxygen barrier layer in this invention is transparent to the radiation with which the printing plate is exposed but has a low permeability to oxygen whereby it is able to protect the photopolymerizable layer from the inhibiting effects of oxygen. It is strongly bonded to the underlying photopolymerizable layer so as to minimize the risk of delamination during handling or storage but is readily removed by the developing solution when the printing plate is processed. By virtue of the oxygen barrier layer, the improved lithographic printing plate of this invention exhibits greatly reduced sensitivity to atmospheric oxygen even on prolonged storage at high temperatures and high humidity levels.

The term "basic compound" is used herein in its broadest sense to include any compound that functions as a proton acceptor. It is particularly preferred that the basic compound is incorporated in the oxygen barrier layer but, alternatively, it can be incorporated in the radiation-sensitive layer or in both the oxygen barrier layer and the radiation-sensitive layer.

Basic compounds which are preferred for use in this invention as agents which reduce thermal fog susceptibility are compounds of the formula:

$$M_x\text{—}R_y$$

wherein M is a cation;

R is —OH, —PO$_4$, —HPO$_4$, —H$_2$PO$_4$, —NO$_2$, —NO$_3$, —SCN, —BF$_4$, —SO$_3$—R$^1$ or —OOC—R$^1$ wherein R$^1$ is hydrogen or a substituted or unsubstituted hydrocarbyl group; and x and y are integers such that x times the valence of M is equal to y times the valence of R.

Basic compounds which are particularly preferred for use in this invention as agents which reduce thermal fog susceptibility are compounds of the formula:

$$M_1\text{—OOC—}R_1$$

wherein M$_1$ is an alkali metal and R$_1$ is an alkyl group or carboxyalkyl group.

The term "hydrocarbyl", as used herein, is intended to cover any organic group that is composed of carbon and hydrogen.

The term "carboxyalkyl", as used herein, is intended to cover alkyl groups substituted with one or more carboxyl groups.

It is particularly preferred that R$_1$ in the above formula represents an alkyl group or carboxyalkyl group of 2 to 12 carbon atoms.

DETAILED DESCRIPTION OF THE INVENTION

In a particular embodiment, the present invention is directed to a novel lithographic printing plate comprising a support having thereon a radiation-sensitive layer adapted to form a lithographic printing surface in which the radiation-sensitive layer is comprised of a photopolymerizable composition comprising (1) at least one addition-polymerizable ethylenically-unsaturated compound and (2) a photopolymerization initiator system comprising (A) a spectral sensitizer that sensitizes in the ultraviolet or visible regions of the spectrum and (B) a polycarboxylic acid co-initiator as herein described; in which the radiation-sensitive layer is overcoated with an oxygen barrier layer comprising fully hydrolyzed polyvinyl alcohol; and in which at least one of the oxygen barrier layer and the radiation-sensitive layer contains a basic compound which serves to reduce thermal fog susceptibility.

In a further particular embodiment, the present invention is directed to a novel process of forming a lithographic printing surface comprising the steps of:

(I) providing a lithographic printing plate comprising a support having thereon a radiation-sensitive layer comprised of the aforesaid photopolymerizable composition, an oxygen barrier layer as hereinabove described and a basic compound which serves to reduce thermal fog susceptibility in at least one of the oxygen barrier layer and the radiation-sensitive layer;

(II) imagewise exposing the radiation-sensitive layer of such lithographic printing plate with an ultraviolet- or visible-light-emitting laser, and (III) subjecting the imagewise-exposed lithographic printing plate to development to remove the non-exposed areas of the radiation-sensitive layer and reveal the underlying support.

As hereinabove described, the improved lithographic printing plates of this invention differ from those of the aforesaid copending commonly-assigned U.S. patent application Ser. No. 395,352 in that they comprise a basic compound, in at least one of the oxygen barrier layer and the radiation-sensitive layer, in an amount sufficient to reduce thermal fog susceptibility of the printing plate. Preferred basic compounds are those of the formula:

$$M_x\text{—}R_y$$

In the above formula, M represents a cation. Examples of suitable cations include ammonium; alkali metals such as sodium, lithium and potassium; alkaline earth metals such as calcium and magnesium; and tetralkylammonium groups such as tetramethylammonium, tetraethylammonium and methyltriethylammonium. R represents —OH, —PO$_4$, —HPO$_4$, —H$_2$PO$_4$, —NO$_2$, —NO$_3$, —SCN, —BF$_4$, —SO$_3$—R$^1$ or —OOC—R$^1$ wherein R$^1$ is hydrogen or a substituted or unsubstituted hydrocarbyl group preferably of 1 to 20 carbon atoms. The term "hydrocarbyl group" is intended to encompass any organic group composed of carbon and hydrogen including alkyl, cycloalkyl and aryl groups. The hydrocarbyl group can be substituted or unsubstituted. Examples of suitable substituents include carboxyl, halo and alkoxy. Substituents with easily extractable hydrogens, such as hydroxy, can in some instances adversely affect the antifoggant activity of the basic compound.

In the above formula, x and y are integers such that x times the valence of M is equal to y times the valence of R. Thus, where both the cation and the anion have the same valency, x and y are each equal to 1.

Particularly preferred for use as the basic compound in the lithographic printing plates of this invention are compounds of the formula:

$$M_1\text{—OOC—}R_1$$

wherein M$_1$ is an alkali metal such as sodium, lithium or potassium and R$_1$ is alkyl or carboxyalkyl preferably containing 2 to 12 carbon atoms.

Specific examples of basic compounds which can be utilized in accordance with this invention to reduce thermal fog susceptibility of the printing plates described herein include the following:
sodium hydroxide
lithium hydroxide
potassium hydroxide
ammonium hydroxide
calcium hydroxide
magnesium hydroxide tetramethylammonium hydroxide
tetraethylammonium hydroxide
methyltriethylammonium hydroxide
monobasic sodium phosphate
dibasic sodium phosphate
tribasic sodium phosphate
monobasic potassium phosphate
potassium nitrite
sodium nitrate
sodium thiocyanate
sodium tetrafluoroborate
sodium salt of sulfanilic acid
magnesium sulfate
sodium salt of 3-chloropropionic acid
lithium benzoate
sodium salt of 3,4,5-trimethoxybenzoic acid
sodium acetate
magnesium acetate
sodium propionate
lithium propionate
potassium propionate
sodium isobutyrate
sodium succinate
sodium glutarate
sodium adipate
monosodium citrate
potassium citrate
dibasic ammonium citrate
lithium citrate
monosodium tartrate
monosodium malonate
disodium malonate
disodium succinate
potassium sorbate
disodium fumarate
sodium gallate
and the like.

Preferred for use as basic compounds in the present invention are salts of weak acids, preferably weak acids having a pKa of at least about 3, and most preferably a pKa of at least about 5. Acid strengths in water solutions are defined in terms of the equilibrium constant, Ka, for the reaction:

$$HA + H_2O \rightarrow H_3O^+ + A^-$$

pKa is defined by the equation:

$$pKa = -LOG\ Ka\ \text{where}$$

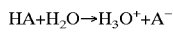

$$Ka = \frac{[H_3O^+][A^-]}{[HA]}$$

The smaller the value of Ka, and greater the value of pKa, the weaker the acid.

The improved photopolymerizable compositions utilized in this invention comprise at least three essential components, namely, an addition-polymerizable ethylenically-unsaturated compound, a spectral sensitizer that sensitizes in the ultraviolet or visible regions of the spectrum, and a polycarboxylic acid co-initiator as herein described. A wide variety of other ingredients can optionally be included in the composition to improve its performance.

Any of a very broad range of addition-polymerizable ethylenically-unsaturated compounds can be utilized in this invention. Examples include acrylates, methacrylates, acrylamides, methacrylamides, allyl compounds, vinyl ethers, vinyl esters, N-vinyl compounds, styrenes, itaconates, crotonates, maleates and the like. The addition-polymerizable ethylenically-unsaturated compound can be a monomer, a pre-polymer such as a dimer, trimer or other oligomer, a homopolymer, a copolymer, or mixtures thereof.

Acrylic compounds are especially useful as the addition-polymerizable ethylenically unsaturated compound. Useful acrylic compounds include mono-functional monomers and polyfunctional monomers. Examples of monofunctional acrylic monomers that are useful in the compositions of this invention include acrylic and methacrylic esters such as ethyl acrylate, butyl acrylate, 2-hydroxypropyl acrylate, cyclohexyl acrylate, 2-ethylhexyl acrylate, methyl methacrylate, ethyl methacrylate, and the like. Examples of polyfunctional acrylic monomers that are useful include:
neopentylglycol diacrylate
pentaerythritol triacrylate
1,6-hexanediol diacrylate
trimethylolpropane triacrylate
tetraethylene glycol diacrylate
1,3-butylene glycol diacrylate
trimethylolpropane trimethacrylate
1,3-butylene glycol dimethacrylate
ethylene glycol dimethacrylate
pentaerythritol tetraacrylate
tetraethylene glycol dimethacrylate
1,6-hexanediol dimethacrylate
ethylene glycol diacrylate
diethylene glycol diacrylate
glycerol diacrylate
glycerol triacrylate
1,3-propanediol diacrylate
1,3-propanediol dimethacrylate
1,2,4-butanetriol trimethacrylate
1,4-cyclohexanediol diacrylate
1,4-cyclohexanediol dimethacrylate
pentaerythritol diacrylate
1,5-pentanediol dimethacrylate, and the like.

Preferred polyfunctional acrylic monomers are those of the formula:

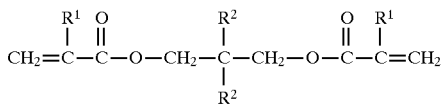

wherein each $R^1$ is independently selected from the group consisting of a hydrogen atom and an alkyl group of 1 to 2 carbon atoms, and each $R^2$ is independently selected from the group consisting of an alkyl group of 1 to 6 carbon atoms and a radical of the formula:

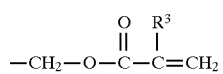

in which $R^3$ is a hydrogen atom or an alkyl group of 1 to 2 carbon atoms.

Poly(alkylene glycol)diacrylates are also especially useful in the present invention as the addition-polymerizable ethylenically-unsaturated compound. Examples are compounds represented by the following formula:

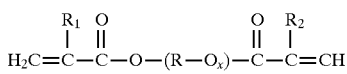

wherein R is an alkylene radical of 2 to 4 carbon atoms, $R_1$ and $R_2$ are independently H or $CH_3$, and x is an integer having a value of from 3 to 50.

Included among the useful poly(alkylene glycol) diacrylates are those comprising ethyleneoxy, propyleneoxy or butyleneoxy groups. As indicated by the above formula, the terminal groups can be acrylate or methacrylate groups.

The photopolymerizable compositions utilized in this invention can include a photocrosslinkable polymer. Typical of such photocrosslinkable polymers are those containing the photosensitive-group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy) cyclohexane.

An essential component of the photo-polymerizable compositions utilized in this invention is a spectral sensitizer that sensitizes in the ultraviolet or visible regions of the spectrum. Any of a very broad range of spectral sensitizers can be used for this purpose. Examples of preferred spectral sensitizers are coumarins, fluoresceins, fluorones, xanthenes, merocyanines, thioxanthones, isoalloxanines and the like.

Particularly preferred spectral sensitizers for use in this invention are 3-substituted coumarins as described in Specht et al, U.S. Pat. No. 4,147,552, issued Apr. 3, 1979. These coumarins have an absorptive maximum between about 250 and about 550 nm. As described in the '552 patent, they can be represented by the formula:

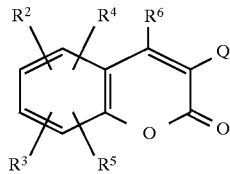

wherein Q is —CN or —Z—$R^1$; Z is carbonyl, sulfonyl, sulfinyl or arylenedicarbonyl;

$R^1$ is alkenyl; alkyl having 1–12 carbon atoms, aryl of 6–10 nuclear carbon atoms; a carbocyclic group of 5–12 carbon atoms; or a heterocyclic group having 5–15 nuclear carbon and hetero atoms;

$R^2$, $R^3$, $R^4$ and $R^5$ each independently is hydrogen, alkoxy having 1–6 carbon atoms, dialkylamino with each alkyl of the dialkylamino group having 1–4 carbon atoms, halogen, acyloxy, nitro, a 5- or 6-membered heterocyclic group, or a group having the formula:

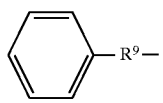

wherein $R^9$ is an alkylene radical having from 1–5 carbon atoms;

$R^6$ is hydrogen, alkyl having 1–4 carbon atoms, aryl of 6–10 carbon atoms; and wherein two or three of $R^2$–$R^5$ and the nuclear carbon atoms to which they are attached can together form a fused ring or fused ring system, each ring being a 5- to 6-membered ring.

Typical examples of useful 3-substituted coumarins include:
3-benzoyl-5,7-dimethoxycoumarin
3-benzoyl-7-methoxycoumarin
3-benzoyl-6-methoxycoumarin
3-benzoyl-8-ethoxycoumarin
7-methoxy-3-(p-nitrobenzoyl)coumarin
3-benzoylcoumarin
3-(p-nitrobenzoyl)coumarin
3-benzoylbenzo[f]coumarin
3,3'-carbonylbis(7-methoxycoumarin)
3-acetyl-7-methoxycoumarin
3-benzoyl-6-bromocoumarin
3,3'-carbonylbiscoumarin
3-benzoyl-7-dimethylaminocoumarin
3,3'-carbonylbis(7-diethylaminocoumarin)
3-carboxycoumarin
3-carboxy-7-methoxycoumarin
3-methoxycarbonyl-6-methoxycoumarin
3-ethoxycarbonyl-6-methoxycoumarin
3-ethoxycarbonyl-7-methoxycoumarin
3-methoxycarbonyl-7-methoxycoumarin
3-acetylbenzo[f]coumarin
3-acetyl-7-methoxycoumarin
3-(1-admantoyl)-7-methoxycoumarin
3-benzoyl-7-hydroxycoumarin
3-benzoyl-6-nitrocoumarin
3-benzoyl-7-acetoxycoumarin
3-[3-(p-ethoxyphenyl)acryloyl]-7-methoxycoumarin
3-benzoyl-7-diethylaminocoumarin
7-dimethylamino-3-(4-iodobenzoyl)coumarin
7-diethylamino-3-(4-iodobenzoyl)coumarin
3,3'-carbonylbis(5,7-diethoxycoumarin)
3-(2-benzofuroyl)-7-(1-pyrrolidinyl) coumarin
7-diethylamino-3-(4-dimethylaminobenzoyl)coumarin
7-methoxy-3-(4-methoxybenzoyl)coumarin
3-(4-nitrobenzoyl)benzo[f]coumarin
3-(4-ethoxycinnamoyl)-7-methoxycoumarin
3-(4-dimethylaminocinnamoyl)coumarin
3-(4-diphenylaminocinnamoyl)coumarin
3-[(3-methylbenzothiaz]-2-ylidene)acetyl]coumarin
3-[(1-methylnaphtho[1,2-d]thiazol-2-ylidene)acetyl]-coumarin
3,3'-carbonylbis(6-methoxycoumarin)
3,3'-carbonylbis(7-acetoxycoumarin)
3,3'-carbonylbis(7-dimethylaminocoumarin)
3,3'-carbonylbis(5,7-di-isopropoxycoumarin)
3,3'-carbonylbis(5,7-di-n-propoxycoumarin)
3,3'-carbonylbis(5,7-di-n-butoxycoumarin)
3,3'-carbonylbis[5,7-di(2-phenylethoxy)coumarin]
3,3'-carbonylbis[5,7-di(2-chloroethoxy)coumarin]
3-cyano-6-methoxycoumarin
3-cyano-7-methoxycoumarin
7-methoxy-3-phenylsulfonylcoumarin
7-methoxy-3-phenylsulfinylcoumarin
1,4-bis(7-diethylamino-3-coumarylcarbonyl)benzene
7-diethylamino-5', 7'-dimethoxy-3,3'carbonylbiscoumarin
7-dimethylamino-3-thenoyl coumarin
7-diethylamino-3-furoyl coumarin
7-diethylamino-3-thenoyl coumarin
3-benzoyl-7-(1-pyrrolidinyl)coumarin
3-(4-fluorosulfonyl)benzoyl-7-methoxycoumarin
3-(3-fluorosulfonyl)benzoyl-7-methoxycoumarin
5,7,6'-trimethoxy-3,3'-carbonylbiscoumarin
5,7,7'-trimethoxy-3,3'-carbonylbiscoumarin
7-diethylamino-6'-methoxy-3,3'-carbonylbiscoumarin
3-nicotinoyl-7-methoxycoumarin
3-(2-benzofuroyl)-7-methoxycoumarin
3-(7-methoxy-3-coumarinoyl)-1-methylpyridinium fluorosulfate
3-(5,7-diethoxy-3-coumarinoyl)-1-methylpyridinium fluoroborate N-(7-methoxy-3-coumarinoylmethyl)pyridinium bromide
3-(2-benzofuroyl)-7-diethylaminocoumarin
7-(1-pyrrolidinyl)-3-thenoylcoumarin
7-methoxy-3-(4-pyridinoyl)coumarin
3,6-dibenzoylcoumarin
N-(7-methoxy-3-coumarinoylmethyl)-N-phenylacetamide and
9-(7-diethylamino-3-coumarinoyl)-1,2,4,5-tetrahydro-3H, 6H,10H[1]benzopyrano[9,9a, 1-gh]quinolazine-10-one.

Of the coumarin sensitizers, the 3-ketocoumarins are especially preferred for use in this invention.

Among the wide variety of sensitizers suitable for use in this invention, the merocyanine sensitizers containing a constrained alkylamino group are particularly preferred because of their ability to provide high photospeed. Such sensitizers are described, for example, in U.S. Pat. No. 4,921,827 which defines a constrained alkylamino group as a saturated heterocyclic structure containing at least one nitrogen atom which is directly attached to an existing aromatic ring of the merocyanine.

A preferred sensitizer for use in the present invention is 10-(3-(4-diethylamino)phenyl)-1-oxo-2-propenyl)-2,3,6,7-tetrahydro-1H,5H,11H-(1) benzopyrano(6,7,8-ij)quinolizin-11-one which has the formula:

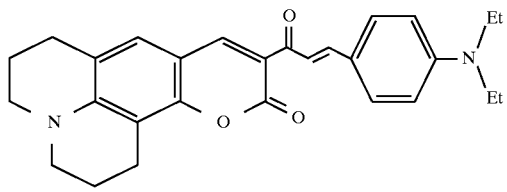

This sensitizer is described in U.S. Pat. Nos. 4,289,844 and 4,366,228, is identified as "Sensitizer A" in U.S. Pat. No. 4,921,827 and is referred to hereinafter as Sensitizer A.

Another preferred sensitizer for use in the present invention is 3,3'-carbonylbis(7-diethylaminocoumarin) which has the formula:

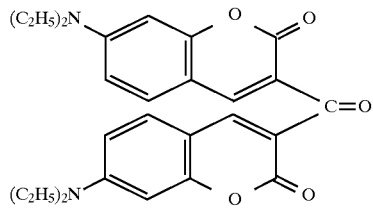

This sensitizer and its synthesis are described in U.S. Pat. No. 4,147,552. It is referred to hereinafter as Sensitizer B.

It is advantageous to use mixtures of spectral sensitizers in this invention and a particularly useful mixture is a mixture of Sensitizer A and Sensitizer B. Sensitizer B is particularly effective when it is desired to expose with an argon-ion laser that emits at 488 nanometers but is not effective for use with a frequency doubled Nd:YAG laser that emits at 532 nanometers. Sensitizer A is equally effective at 488 nanometers and 532 nanometers but its efficiency is significantly less than that of Sensitizer B. By using a mixture of Sensitizers A and B, optimum results are obtained whether the chosen exposure source is an argon-ion laser or a frequency doubled Nd:YAG laser.

As hereinabove described, the photopolymerization initiator system utilized in this invention includes a spectral sensitizer that sensitizes in the ultraviolet or visible regions of the spectrum and a polycarboxylic acid co-initiator comprising an aromatic moiety substituted with a hetero atom selected from nitrogen, oxygen and sulfur and comprising at least two carboxyl groups with at least one of the carboxyl groups being linked to the hetero atom. N-aryl polycarboxylic acid co-initiators are especially effective in this invention and examples of preferred N-aryl polycarboxylic acid co-initiators include those of the following formulae I, II, III, IV and V:

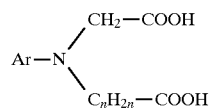

wherein Ar is a substituted or unsubstituted aryl group and n is an integer with a value of from 1 to 5.

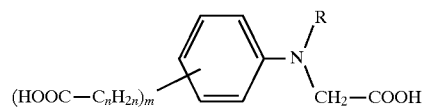

wherein n is an integer with a value of from 1 to 5,
m is an integer with a value of from 1 to 5, and
R is hydrogen or an alkyl group of 1 to 6 carbon atoms.

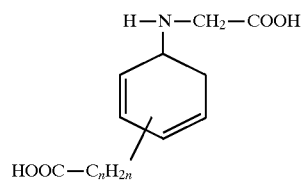

wherein n is an integer with a value of from 1 to 5.

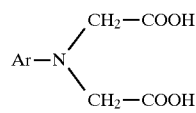

wherein Ar is a substituted or unsubstituted aryl group.

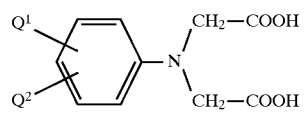

wherein $Q^1$ and $Q^2$ are independently hydrogen, alkyl, alkoxy, thioalkyl, aryl, aryloxy or halogen.

Preferably $Q^1$ and $Q^2$ are independently selected from the group consisting of hydrogen, methyl, ethyl, propyl, butyl, methoxy, ethoxy, propoxy, butoxy, thiomethyl, thioethyl and chloro.

Specific examples of N-aryl, O-aryl and S-aryl polycarboxylic acids that can be used as co-initiators in this invention include:
anilinediacetic acid
(p-acetamidophenylimino)diacetic acid
3-(bis(carboxymethyl)amino)benzoic acid
4-(bis(carboxymethyl)amino)benzoic acid
2-[(carboxymethyl)phenylamino]benzoic acid
2-[(carboxymethyl)methylamino]benzoic acid
2-[(carboxymethyl)methylamino]-5-methoxybenzoic acid
3-[bis(carboxymethyl)amino]-2-naphthalenrecarboxylic acid
N-(4-aminophenyl)-N-(carboxymethyl)glycine
N,N'-1,3-phenylenebisglycine
N,N'-1,3-phenylenebis[N-(carboxymethyl)]glycine
N,N'-1,2-phenylenebis[N-(carboxymethyl)]glycine
N-(carboxymethyl)-N-(4-methoxyphenyl)glycine N-(carboxymethyl)-N-(3-methoxyphenyl)glycine
N-(carboxymethyl)-N-(3-hydroxyphenyl)glycine
N-(carboxymethyl)-N-(3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimethylphenyl)glycine
N-(carboxymethyl)-N-(3,4-dimethylphenyl)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthranilic acid
N-(carboxymethyl)-N-propylanthranilic acid
5-bromo-N-(carboxymethyl)anthranilic acid
N-(2-carboxyphenyl)glycine
o-dianisidine-N,N,N', N'-tetraacetic acid
N,N'-[1,2-ethanediylbis(oxy-2,1-phenylene)]bis [N-(carboxymethyl)glycine]
4-carboxyphenoxyacetic acid
catechol-O,O'-diacetic acid
4-methylcatechol-O,O'-diacetic acid
resorcinol-O,O'-diacetic acid
hydroquinone-O,O'-diacetic acid
α-carboxy-o-anisic acid
4,4'-isopropylidenediphenoxyacetic acid
2,2'-(dibenzofuran-2,8-diyldioxy)diacetic acid
2-(carboxymethylthio)benzoic acid
5-amino-2-(carboxymethylthio)benzoic acid
3-[(carboxymethyl)thio]-2-naphthalenecarboxylic acid In addition to the spectral sensitizer and polycarboxylic acid co-initiator, it is particularly preferred to include in the photopolymerization initiator system utilized in this invention a second co-initiator selected from the group consisting of (1) iodonium salts, (2) titanocenes, (3) haloalkyl-substituted s-triazines, (4) hexaaryl bisimidazoles, (5) photooxidants containing a heterocyclic nitrogen atom that is substituted by either an alkoxy group or an acyloxy group such as, for example, the N-alkoxypyridinium salts, and (6) alkyltriarylborate salts. The use of one or more of the aforesaid second co-initiators improves the performance of the photopolymerizable composition in terms of meeting the dual requirements of high photospeed and good shelf-life.

Preferred iodonium salts for use in this invention are iodonium salts of the formula:

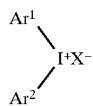

in which $Ar^1$ and $Ar^2$ independently represent substituted or unsubstituted aromatic groups and $X^-$ represents an anion.

Particularly preferred iodonium salts for use in this invention are diaryl iodonium salts of the formula:

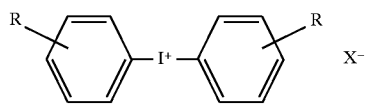

wherein each R is independently hydrogen, halogen, alkyl, alkoxy or nitro and X is an anion such as $Cl^-$, $BF_4^-$, $PF_6^-$, $AsF_6^-$ or $SbF_6^-$.

Specific examples of iodonium salts that are useful in this invention include:

diphenyliodonium hexafluorophosphate
4-octyloxyphenylphenyliodonium hexafluorophosphate
bis(dodecylphenyl)iodonium hexafluoroantimonate
4-isooctyloxyphenylphenyliodonium hexafluorophosphate,
diphenyliodonium trifluoromethanesulfonate
4-octyloxyphenylphenyliodonium tosylate
4,4'-di-t-butyl-diphenyliodonium hexafluorophosphate
4-butoxyphenylphenyliodonium trifluoroacetate
diphenyliodonium naphthalenesulfonate
3,3'-dinitrodiphenyliodonium hexafluorophosphate
4,4'-dichlorodiphenyliodonium tosylate
4-methoxyphenylphenyliodonium tetrafluoroborate
and the like.

The use of iodonium salts in combination with spectral sensitizers to form a photopolymerization initiator system is well known in the art. References disclosing such combinations are discussed herein in the section entitled "Background Of The Invention." Such references include Japanese Patent No. 1,660,964 (KOKOKU 3-62162) assigned to the Agency for Industrial Science and Technology, which describes photopolymerization initiator systems comprising a 3-ketocoumarin and a diaryl iodonium salt, European Patent Application No. 0 290 133, published Nov. 9, 1988, which describes photopolymerization initiator systems comprising a spectral sensitizer, an aryliodonium salt and an electron donor having an oxidation potential that is greater than zero and less than or equal to that of p-dimethoxybenzene; and U.S. Pat. No. 4,921,827 which describes photopolymerization initiator systems comprising a merocyanine sensitizer containing a constrained alkylamino group and a co-initiator selected from diaryl iodonium salts, halogenated triazines and triaryl sulfonium salts. However, it was not heretofore known to include an N-aryl, O-aryl or S-aryl polycarboxylic acid as a co-initiator in a photopolymerization initiator system containing both a spectral sensitizer and an iodonium salt.

In marked contrast with the benefits provided by the use in this invention of iodonium salts as a second co-initiator, use of sulfonium or diazonium salts for this purpose has been found to bring about no change in photospeed or a reduction in photospeed.

Titanocenes which are especially useful as a second co-initiator in the photopolymerization initiator system described herein include those described in U.S. Pat. No. 5,306,600. Of particular interest is the titanocene compound bis(η5-2,4-cyclopentadienyl-1-yl)-bis {2,6-difluoro-3-(1H-pyrrol-1-yl) phenyl}titanium which has the following formula:

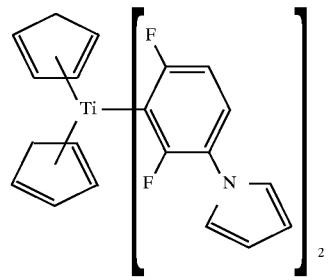

Another class of compounds that are useful as a second co-initiator in the present invention are the photooxidants described in U.S. Reissue Pat. No. 28,240, the disclosure of which is incorporated herein by reference. These are photooxidants which contain a heterocyclic nitrogen atom that is substituted by either an alkoxy group or an acyloxy group. As described in U.S. Pat. No. Re 28,240 typical photooxidants of this class are represented by one of the formulas:

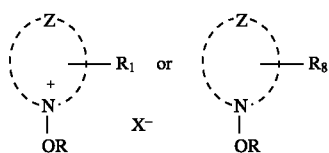

wherein
R₁ can be any of the following:
a. a methine linkage terminated by a heterocyclic nucleus of the type contained in cyanine dyes, e.g., those set forth in Mees and James, "The Theory of the Photographic Process," Macmillan, 3rd ed, pp. 198–232; the methine linkage can be substituted or unsubstituted, e.g., —CH=, —C(CH₃)=, —C(C₆H₅)=, —CH=CH—, —CH=CH—CH=, etc.;
b. an alkyl radical preferably containing one to eight carbon atoms including a substituted alkyl radical;
c. an aryl radical including a substituted aryl radical such as a phenyl radical, a naphthyl radical, a tolyl radical, etc.;
d. a hydrogen atom;
e. an acyl radical having the formula:

wherein R₉ is hydrogen or an alkyl group preferably having one to eight carbon atoms;
f. an anilinovinyl radical such as a radical having the formula:

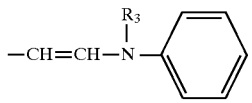

wherein R₃ is hydrogen, acyl or alkyl, or
g. a styryl radical including substituted styryl radicals, e.g.,

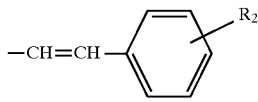

wherein R₂ is hydrogen, alkyl, aryl, amino, including dialkylamino such as dimethylamino;
R₈ can be either of the following:
a. a methine linkage terminated by a heterocyclic nucleus of the type contained in merocyanine dyes, e.g., those set forth in Mees and James (cited above); the methine linkage can be substituted or unsubstituted; or
b. an allylidene radical including a substituted allylidene radical such as a cyanoallylidene radical, an alkylcarboxyallylidene radical or an alkylsufonylallylidene radical;
R can be either:
a. an alkyl radical preferably having one to eight carbon atoms such as methyl, ethyl, propyl, butyl, etc., including a substitued alkyl radical such as sulfoalkyl, e.g., —(CH₂)₃SO₃—, an aralkyl, e.g., benzyl or pyridinatooxyalkyl salt, e.g., —(CH₂)₃—

O—Y wherein Y is substituted or unsubstituted pyridinium salt; etc.,
b. an acyl radical, e.g.,

wherein R₄ is an alkyl radical preferably having one to eight carbon atoms or aryl radical, e.g., methyl, ethyl, propyl, butyl, phenyl, naphthyl, etc.

Z represents the atoms necessary to complete a five- to six-membered heterocyclic nucleus, which nucleus can contain at least one additional heteroatom such as oxygen, sulfur, selenium or nitrogen, e.g., a pyridine nucleus, a quinoline nucleus, etc.; and X⁻ represents an acid anion, e.g, chloride, bromide, iodide, perchlorate, sulfamate, thiocyanate, p-toluenesulfonate, methyl sulfate, tetrafluorobotate, etc.

Examples of photooxidants of the class described in Reissue U.S. Pat. No. Re28,240 which are especially preferred for use in this invention include:

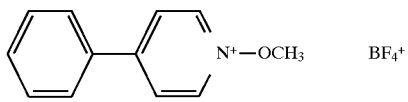

N-methyl-4-phenylpyridinium tetrafluoroborate

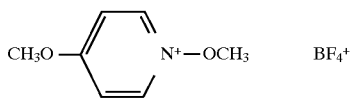

N-4-dimethoxypyridinium tetrafluoroborate

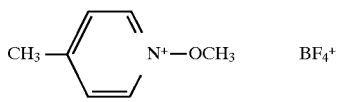

N-methoxy-4-methylpyridinium tetrafluoroborate

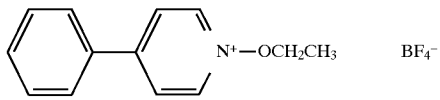

N-ethoxy-4-phenylpyridinium tetrafluoroborate

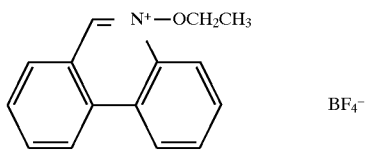

N-ethoxyphenanthridinium tetrafluoroborate

Of the photooxidants of Reissue U.S. Pat. No. Re28,240, those that are most preferred for use in the present invention are the N-alkoxypyridinium salts.

Haloalkyl-substituted s-triazines are also useful as a second co-initiator in the present invention. Preferred haloalkyl-substituted s-triazines for use in this invention are compounds of the formula:

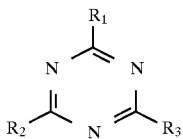

wherein $R_1$ is a substituted or unsubstituted aliphatic or aromatic radical and $R_2$ and $R_3$ are, independently, haloalkyl groups.

In the above formula, it is especially preferred that $R_2$ and $R_3$ are haloalkyl groups of 1 to 4 carbon atoms.

Particularly preferred haloalkyl-substituted s-triazines for use in this invention are compounds of the formula:

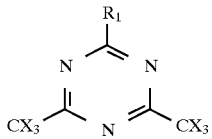

wherein $R_1$ is a substituted or unsubstituted aliphatic or aromatic radical and each X is, independently, a halogen atom.

A specific example of a preferred haloalkyl-substituted s-triazine for use in this invention is 2,4,6-tris (trichloromethyl)-s-triazine.

Hexaaryl bisimidazoles represent a further class of compounds that are useful as a second co-initiator in the present invention. An example of a useful hexaaryl bisimidazole is the compound 2,2'-bis (o-chlorophenyl)-4,4',5,5'-tetraphenylbisimidazolyl which has the formula:

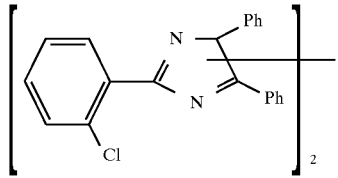

wherein Ph represents a phenyl group.

Alkyltriarylborate salts represent a still further class of compounds that are useful as a second co-initiator in the present invention. The alkyltriarylborate salts which are especially useful are salts of the formula:

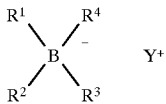

wherein each of $R^1$, $R^2$ and $R^3$ is, independently, an aryl group of 6 to 12 carbon atoms, $R^4$ is an alkyl group of 1 to 12 carbon atoms, and Y is a counterion such as ammonium, tetramethylammonium or an alkali metal. The three aryl groups are preferably phenyl or lower alkyl substituted phenyl groups such as tolyl and xylyl. The alkyl group is preferably lower alkyl such as methyl, ethyl or n-butyl.

Iodonium salts are particularly useful in this invention because of their ability to both substantially improve photospeed and substantially improve shelf-life. Thus, a composition containing both an N-aryl, O-aryl or S-aryl polycarboxylic acid and an iodonium salt represents a preferred embodiment of the invention. Incorporating a titanocene in the composition, in addition to the iodonium salt and the polycarboxylic acid, affords additional photospeed which is not obtainable by simply increasing the concentration of either the iodonium salt or the polycarboxylic acid.

Preferred iodonium salts for use in this invention are the non-toxic alkoxy-substituted salts described in U.S. Pat. Nos. 4,882,201, 4,981,881, 5,010,118, 5,082,686 and 5,144, 051. These compounds are preferably utilized as the hexafluorophosphate salt rather than the hexafluoroantimonate salt when the lithographic printing plate utilizes an aluminum support. The reason for such preference is that the incompatibility of the hexafluoroantimonate counter-ion with the aluminum substrate harms the shelf-life of the plate.

In the photopolymerizable compositions utilized in this invention, the spectral sensitizer is typically used in an amount of from about 0.001 to about 0.1 parts per part by weight of the addition-polymerizable ethylenically-unsaturated compound, while the polycarboxylic acid co-initiator is typically used in an amount of from about 0.05 to about 0.5 parts per part by weight of the addition-polymerizable ethylenically-unsaturated compound. When a second co-initiator is employed, it is typically used in an amount of from about 0.05 to about 0.5 parts per part by weight of the addition-polymerizable ethylenically-unsaturated compound.

The photopolymerizable compositions utilized in this invention can optionally contain a film-forming binder. Such use of film-forming binders can be particularly advantageous in improving the wear resistance of the layer formed therefrom. Useful film-forming binders include styrene-butadiene copolymers; silicone resins; styrene-alkyd resins; silicone-alkyd resins; soy-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly (ethylene-co-alkaryloxyalkylene terephthalate); phenol-formaldehyde resin; ketone resins; polyamides; polycarbonates; polythiocarbonates; poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin.

Particular advantages are achieved by the use of acetal polymers as the film-forming binder. Examples of useful acetal polymers are those described in U.S. Pat. Nos. 4,652, 604, 4,741,985, 4,940,646, 5,169,897 and 5,169,898.

In U.S. Pat. No. 4,652,604, the acetal polymer contains acetal groups of three types, namely six-membered cyclic acetals, five-membered cyclic acetals and intermolecular acetals. In U.S. Pat. No. 4,741,985, the acetal polymer is a mono-acetal containing a six-membered cyclic acetal group. In U.S. Pat. No. 4,940,646, the acetal polymer contains vinyl acetal units derived from an aldehyde that contains hydroxyl groups. In U.S. Pat. No. 5,169,897 the acetal polymer is a binary acetal polymer comprised of recurring units which include two six-membered cyclic acetal groups, one of which is unsubstituted or substituted with an alkyl or hydroxyalkyl group and the other of which is substituted with an aromatic or heterocyclic moiety. In U.S. Pat. No. 5,169,898 the acetal polymer is a ternary acetal polymer comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

The acid-substituted ternary acetal polymers of U.S. Pat. No. 5,169,898 are especially useful in this invention. As described in the '898 patent these acid-substituted ternary acetal polymers have recurring units represented by the formula:

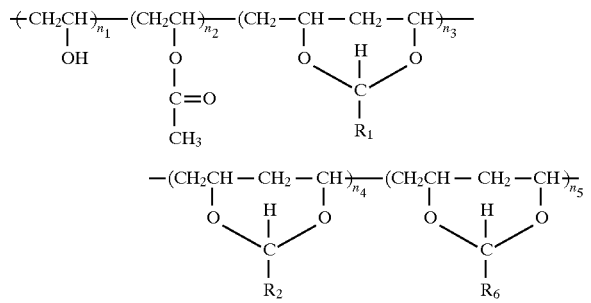

wherein $R_1$ is —H, —$C_nH_{2n+1}$ or —$C_nH_{2n}$—OH where n=1–12

$R_2$ is

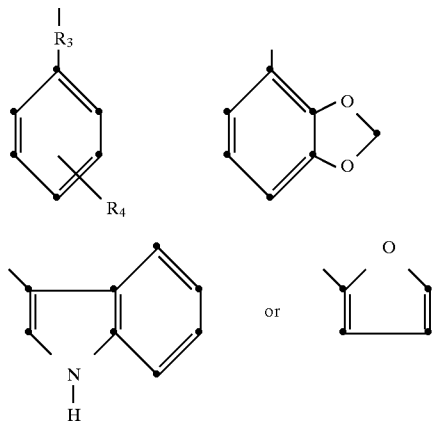

or
where $R_3$ is

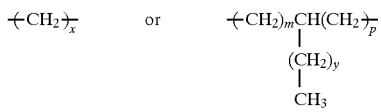

and
x=0–8
m=0–8
y=0–8
p=0–8

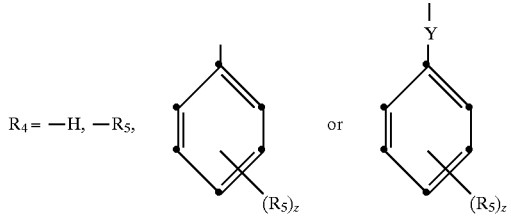

in which

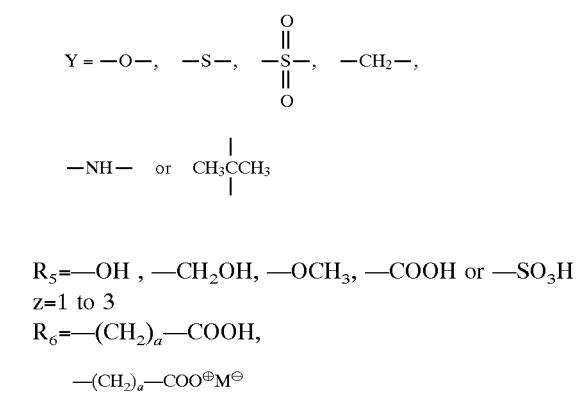

$R_5$= —OH, —$CH_2OH$, —$OCH_3$, —COOH or —$SO_3H$
z=1 to 3
$R_6$= —$(CH_2)_a$—COOH,

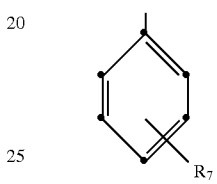

or

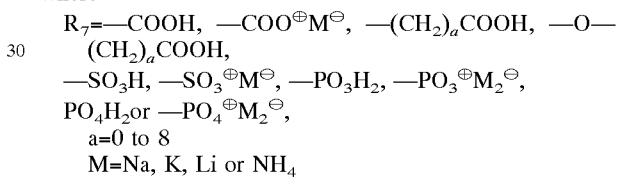

where
$R_7$= —COOH, —COO$^\oplus$M$^\ominus$, —$(CH_2)_a$COOH, —O—$(CH_2)_a$COOH,
—$SO_3H$, —$SO_3^\oplus$M$^\ominus$, —$PO_3H_2$, —$PO_3^\oplus$M$_2^\ominus$,
$PO_4H_2$ or —$PO_4^\oplus$M$_2^\ominus$,
a=0 to 8
M=Na, K, Li or $NH_4$
and
$n_1$=0–25 mole %, preferably 3 to 15 mole %
$n_2$=2–25 mole %, preferably 5 to 15 mole %
$n_3$=10–70 mole %, preferably 15 to 50 mole %
$n_4$=10–60 mole %, preferably 12 to 45 mole %
$n_5$=10–45 mole %, preferably 15 to 30 mole %.

As indicated by the above structural formula, the acid-substituted ternary acetal polymers can be tetramers, in which the recurring unit comprise a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The acid-substituted ternary acetal polymers provide lithographic printing plates characterized by improved abrasion-resistance, improved resistance to chemical attack, extended press performance and enhanced roll-up properties in comparison with other acetal polymers. Lithographic printing plates utilizing the acid-substituted ternary acetal polymers as polymeric binders also have the important advantage that they can be processed in aqueous alkaline developing solutions containing very low concentrations of organic solvents. This is highly advantageous in view of the high costs and environmental concerns associated with the use of organic solvents. Since the acid-substituted ternary acetal polymers are fully soluble in aqueous alkaline developing solutions, they avoid the problems encountered with binders that cause the coating to break-up in particulate form.

A particularly preferred binder for use in this invention is the acid-substituted ternary acetal polymer described in Example 1 of U.S. Pat. No. 5,169,898, which is referred to hereinafter as binder ATAP.

In the present invention, the combination of a diaryl iodonium salt and an N-aryl, O-aryl or S-aryl polycarboxylic acid gives an excellent combination of high photospeed and long shelf-life and thus represents a preferred embodiment of the invention. The combination of a diphenyliodonium salt and anilinediacetic acid represents a particularly preferred embodiment. An optimum formulation includes the diphenyliodonium salt, the anilinediacetic acid and binder ATAP.

Lithographic printing plates that are capable of being imagewise exposed with ultraviolet- or visible-light-emitting lasers can be prepared by coating the photopolymerizable compositions described herein on a suitable support, and removing the solvent by drying at ambient or elevated temperatures. Any one of a variety of conventional coating techniques can be employed, such as extrusion coating, doctor-blade coating, spray-coating, dip coating, whirl coating, spin coating, roller coating, etc.

Coating compositions can be prepared by dispersing or dissolving the components in any suitable solvent or combination of solvents. The solvents are chosen to be substantially unreactive toward the components and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber-based materials such as paper, polyethylene-coated paper, polypropylene-coated paper, parchment, cloth, etc., sheets and foils of such materials as aluminum, copper, magnesium, zinc, etc.; glass and glass coated with such metals as chromium alloys, steel, silver, gold, platinum, etc.; synthetic resins and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized.

The support can be preliminarily coated—i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc; carboxymethyl cellulose, gelatin; polyacrylamide; and similar polymer materials.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

Aluminum has been used for many years as a support for lithographic printing plates and is particularly preferred for use with the printing plates of this invention. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,538,683, 4,564,429, 4,582,996, 4,618,405, 4,735,696, 4,897,168 and 4,919,774.

In the manufacture of lithographic printing plates, the graining process is typically followed by an anodizing process, utilizing an acid such as sulfuric or phosphoric acid, and the anodizing process is typically followed by a process which renders the surface hydrophilic such as a process of thermal silication or electrosilication. The anodization step serves to provide an anodic oxide layer and is preferably controlled to create a layer of at least $0.3 \text{ g/m}^2$. Processes for anodizing aluminum to form an anodic oxide coating and then hydrophilizing the anodized surface by techniques such as silication are very well known in the art, and need not be further described herein.

Included among the many patents relating to processes for anodization of lithographic printing plates are U.S. Pat. Nos. 2,594,289, 2,703,781, 3,227,639, 3,511,661, 3,804,731, 3,915,811, 3,988,217, 4,022,670, 4,115,211, 4,229,266 and 4,647,346. Illustrative of the many materials useful in forming hydrophilic barrier layers are polyvinyl phosphonic acid, polyacrylic acid, polyacrylamide, silicates, zirconates and titanates. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 4,090,880, 4,153,461, 4,376,914, 4,383,987, 4,399,021, 4,427,765, 4,427,766, 4,448,647, 4,452,674, 4,458,005, 4,492,616, 4,578,156, 4,689,272, 4,935,332 and European Patent No. 190,643.

Radiation-sensitive layers of lithographic printing plates of this invention can contain a variety of optional ingredients such as antioxidants, surfactants, anti-scumming agents, and the like.

The radiation-sensitive layer can contain pigments preferably having a maximum average particle size less than about 3 micrometers. These pigments can provide a visible coloration to an image before or after development of the plate. Useful pigments are well known in the art and include titanium dioxide, zinc oxide, copper phthalocyanines, halogenated copper phthalocyanines, quinacridine, and colorants such as those sold commercially under the trade name Hostaperm. The pigments are generally present in the composition in an amount within the range of from 0 to about 50 percent (by weight) based on the total dry composition weight. Preferred amounts are within the range of from about 5 to about 20 percent (by weight).

The exposed printing plate can be developed by flushing, soaking, swabbing or otherwise treating the radiation-sensitive layer with a solution (hereinafter referred to as a developer) which selectively solubilizes (i.e., removes) the unexposed areas of the radiation-sensitive layer. The developer is preferably an aqueous solution having a pH as near to neutral as is feasible.

In a preferred form, the developer includes a combination of water and an alcohol that is miscible with water, or able to be rendered miscible by the use of cosolvents or surfactants, as a solvent system. The proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the radiation-sensitive layer during development and that is miscible with water in the proportions chosen for use can be employed. Exemplary of useful alcohols are glycerol, benzyl alcohol, 2-phenoxy-ethanol, 1,2-propanediol, sec-butyl alcohol and ethers derived from alkylene glycols—i.e., dihydroxy poly (alkylene oxides)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

After development, the printing plate can be treated in any known manner consistent with its intended use. For example, lithographic printing plates are typically subjected to desensitizing etches.

In the photopolymerizable compositions utilized in this invention, the high level of sensitivity, on the order of 0.1 mJ/cm$^2$, is achieved by means of the chemical amplification effects provided by free-radical initiated polymerization of addition-polymerizable polymerizable ethylenically-unsaturated compounds. The propagation of radical reactions is quenched by oxygen, so it is necessary to provide the photopolymerizable coating with an oxygen barrier.

As hereinabove described, the oxygen barrier layer utilized in this invention comprises fully hydrolyzed polyvinyl alcohol. This oxygen barrier layer serves to prevent quenching of initiating and propagating radicals involved in the photopolymerization process. By virtue of the use of fully hydrolyzed polyvinyl alcohol, excellent adhesion of the oxygen barrier layer to the underlying photopolymerizable layer is achieved. By virtue of the incorporation of a basic compound in either the oxygen barrier layer or the radiation-sensitive layer, the thermal fogging problem is effectively overcome.

Polyvinyl alcohol is obtained through methanolysis of poly(vinyl acetate) catalyzed by sodium hydroxide. Neutralization of the base is used to control the degree of hydrolysis, and fully hydrolyzed polyvinyl alcohol is obtained when the methanolysis reaction is allowed to go to completion. For commercial grades of polyvinyl alcohol, "fully hydrolyzed" is taken to mean 97.5–99.5% degree of hydrolysis, as described by T. Okaya in "General Properties of Polyvinyl Alcohol in Relation to Its Applications" in *Polyvinyl Alcohol—Developments*, C. A. Finch, ed., John Wiley & Sons (1992).

Polyvinyl alcohols suitable for use as oxygen barrier layers in this invention are well known commercially available materials. They preferably have an average molecular weight in the range of from about 3,000 to about 120,000. Polyvinyl alcohols that are fully hydrolyzed, for example about 98% hydrolyzed, and thus are useful in this invention include AIRVOL 107 polyvinyl alcohol which is available from AIR PRODUCTS CORPORATION and MOWIOL 4-98 polyvinyl alcohol which is available from HOECHST-CELANESE CORPORATION.

To form an effective oxygen barrier layer, the polyvinyl alcohol is preferably coated in an amount of from about 0.5 to about 5 g/m$^2$ and more preferably about 1 to about 3 g/m$^2$.

To overcome the thermal fog problem, the basic compound is preferably incorporated in the lithographic printing plate in an amount of about 0.02 to about 2 millequivalents per gram of polyvinyl alcohol and more preferably in an amount of about 0.05 to about 0.8 millequivalents per gram of polyvinyl alcohol.

It is particularly preferred to utilize sodium propionate as the basic compound and to incorporate it in the oxygen barrier layer, with a preferred range being 2–200 mg sodium propionate/g of polyvinyl alcohol and a more preferred range being 5–75 mg sodium propionate/g of polyvinyl alcohol. Sodium propionate is not only very effective in preventing thermal fog but also serves as a preservative to prevent microbial growth in the aqueous polyvinyl alcohol solutions that are used to prepare the oxygen barrier layer.

The lithographic printing plates of this invention are of high sensitivity, such as a sensitivity in the range of from about 50 to about 500 microjoules per square centimeter. They are advantageously designed to have a peak sensitivity at about 488 nanometers to adapt them for exposure with an argon-ion laser or to have a peak sensitivity at about 532 nanometers to adapt them for exposure with a frequency doubled Nd:YAG laser. As hereinabove described, they can be designed to have very high sensitivities at both 488 and 532 nanometers to increase their versatility.

The invention is further illustrated by the following examples of its practice taken in conjunction with the comparative examples which illustrate the improved performance achieved with the improved lithographic printing plate of this invention.

EXAMPLES 1–3

A coating composition was prepared by combining 3.33 parts by weight of a 20% by weight copper phthalocyanine dispersion; 18.07 parts by weight of a 10% by weight solution in 1-methoxy-2-propanol of ATAP; 1.33 parts by weight of pentaerythritol triacrylate, 0.67 parts by weight of an alkoxylated triacrylate (available from SARTOMER CORPORATION under the trademark SARTOMER 9008); 1.11 parts by weight of the bis(2-hydroxyethylmethacrylate) ester of phosphoric acid (available from CHUGAI BOYEKI CORPORATION under the trademark KAYAMER PM-2 difunctional monomer), 0.04 parts by weight of 3,3'-carbonylbis(7-diethylaminocoumarin); 0.31 parts by weight of anilinediacetic acid; 0.22 parts by weight of diphenyliodonium hexafluorophosphate; 0.33 parts by weight of bis($\eta^5$-2,4-cyclopentadien-1-yl)bis[2,6-difluoro-3-(1H-pyrrol-1-yl)phenyl]titanium (available from CIBA-GEIGY CORPORATION under the trademark CGI-784); 0.002 parts by weight of 3-t-butyl-4-hydroxy-5-methylphenylsulfide; 14.19 parts by weight of 2-butanone; 23.65 parts by weight of toluene; and 36.75 parts by weight of 1-methoxy-2-propanol.

The above-described coating composition was coated on a grained and anodized aluminum support at a dry coating weight of 1.2 g/m$^2$ to form a lithographic printing plate.

Oxygen barrier formulations were prepared from MOWIOL 4-98 polyvinyl alcohol obtained from HOECHST-CELANESE CORPORATION. (This polyvinyl alcohol is about 98% hydrolyzed.) A control formulation contained only the polyvinyl alcohol and water. A formulation that is exemplary of the invention and is designated Example 1 also contained sodium propionate. In a second formulation that is exemplary of the invention and is designated Example 2, sodium thiocyanate was used in place of the sodium propionate. In a third formulation that is exemplary of the invention and is designated Example 3, magnesium sulfate was used in place of the sodium propionate. In comparative formulations 1 and 2, sodium chloride and ammonium chloride, respectively, were used in place of the sodium propionate. The formulations prepared were as indicated in Table I below in which all amounts reported are in grams:

TABLE I

|  | Control | Example 1 | Example 2 | Example 3 | Comparison 1 | Comparison 2 |
|---|---|---|---|---|---|---|
| MOWIOL 4-98 | 66.47 | 66.47 | 66.47 | 49.31 | 49.31 | 49.31 |
| Water | 33.53 | 33.43 | 33.20 | 50.59 | 50.59 | 50.59 |
| Na propionate | — | 0.10 | — | — | — | — |
| NaSCN | — | — | 0.33 | — | — | — |
| $MgSO_4$ | — | — | — | 0.10 | — | — |
| NaCl | — | — | — | — | 0.10 | — |
| $NH_4Cl$ | — | — | — | — | — | 0.10 |
|  | 100.00 | 100.00 | 100.00 | 100.00 | 100.00 | 100.00 |

Each of the oxygen barrier formulations described above was applied over the above-described photopolymerizable layer at a dry coverage of 2.2 g/m$^2$. The susceptibility to thermal fogging was measured by heating each sample in a forced air oven at 100° C. for 5 minutes, rinsing with water and developing with the developing composition described in Example 1 of copending commonly assigned U.S. patent application Ser. No. 268,100, filed Jun. 29, 1994, "Aqueous Developer For Lithographic Printing Plates Which Exhibits Reduced Sludge Formation" by Gary R. Miller, John E. Walls and Melanie A. Felker. This developer composition is as follows:

| Ingredient | Grams |
|---|---|
| 2-phenoxy propanol | 49.50 |
| nonanoic acid | 54.00 |
| sebacic acid (94%) | 6.00 |
| potassium hydroxide (90%) | 19.15 |
| sodium hydroxide (90%) | 5.20 |
| sodium octyl sulfate (31%) | 65.00 |
| potassium carbonate (anhydrous) | 7.50 |
| $K_2B_4O_7 \cdot 4H_2O$ | 5.00 |
| *BURST RSD-10 Antifoam (10%) | 0.40 |
| **TIRON | 10.00 |
| ***CARBOWAX 200 | 10.00 |
| trisodium citrate dihydrate | 5.00 |
| water | 788.25 |

*Trademark for a polydimethyl siloxane antifoaming agent available commercially from HYDROLABS COMPANY
**Trademark for 4,5-dihydroxy-1,3-benzenedisulfonic acid disodium salt which is available commercially from ALDRICH CHEMICALS
***Trademark for a poly(ethylene glycol) which is available commercially from UNION CARBIDE CORPORATION The increase in optical density relative to the uncoated areas was determined for each sample tested. The results obtained were as follows:

Control—+0.23
Example 1—0
Example 2—0
Example 3—0.17
Comparison 1—+0.61
Comparison 2−+0.61

As indicated by the experimental results reported above, the samples which contained sodium propionate (Example 1) and sodium thiocyanate (Example 2) were completely free from stain. The sample which contained magnesium sulfate (Example 3) exhibited a moderately stained background but less stained than the control. The incorporation of sodium chloride (comparison 1) and ammonium chloride (comparison 2) in the oxygen barrier layer actually increased the thermal fogging susceptibility as evidenced by the much higher degree of background stain as compared to the control coating. In contrast with the bases and basic salts that serve as antifoggants in this invention, sodium chloride and ammonium chloride are acid salts. As shown by the above data, they not only do not function as antifoggants but actually increase the level of thermal fog. The mechanisms accounting for such increases or decreases in thermal fog are not presently understood.

EXAMPLES 4–25

A photopolymerizable composition similar to that described in connection with Examples 1–3, except for the use of N-methoxy-4-phenylpyridinium tetrafluoroborate in place of diphenyliodonium hexafluorophosphate, was prepared and coated on the grained and anodized aluminum support. Oxygen barrier formulations were prepared in the same manner as that described in connection with Examples 1–3 with the antifogging agent incorporated in the oxygen barrier layer to control thermal fog susceptibility being identified in Table II below. Table II reports the name and formula of the antifogging agent, the amount employed in milligrams per square meter, and the value for the density increase.

TABLE II

| Example No. | Antifogging Agent | Formula | Concentration (mg/m$^2$) | Density Increase |
|---|---|---|---|---|
| Control | None | — | — | 0.23 |
| 4 | sodium tetrafluoroborate | $NaBF_4$ | 43 | 0.14 |
| 5 | sodium phosphate, monobasic | $NaH_2PO_4$ | 43 | 0.05 |

TABLE II-continued

| Example No. | Antifogging Agent | Formula | Concentration (mg/m$^2$) | Density Increase |
|---|---|---|---|---|
| 6 | sodium malonate, monobasic | NaO$_2$CCH$_2$CO$_2$H | 56 | 0.18 |
| 7 | sodium gallate | (HO)$_3$C$_6$H$_2$CO$_2$Na | 86 | 0.21 |
| 8 | sodium sulfanilate | 4-(H$_2$N)C$_6$H$_4$SO$_3$H | 87 | 0.22 |
| 9 | sodium tartrate, monobasic | NaO$_2$CCH(OH)CH(OH)CO$_2$H | 77 | 0 |
| 10 | sodium citrate, monobasic | NaO$_2$CCH$_2$C(OH)(CO$_2$H)CH$_2$CO$_2$H | 96 | 0 |
| 11 | potassium nitrite | KNO$_2$ | 43 | 0 |
| 12 | sodium 3-chloropropionate | NaO$_2$CCH$_2$CH$_2$Cl | 58 | 0 |
| 13 | lithium benzoate | LiO$_2$CC$_6$H$_5$ | 43 | 0 |
| 14 | sodium tartrate, dibasic | NaO$_2$CCH(OH)CH(OH)CO$_2$Na | 87 | 0 |
| 15 | sodium fumarate, dibasic | NaO$_2$CCH=CHCO$_2$Na | 72 | 0 |
| 16 | potassium sorbate | CH$_3$CH=CHCH=CHCO$_2$K | 43 | 0 |
| 17 | sodium citrate, dibasic | NaO$_2$CCH$_2$C(OH)(CO$_2$H)CH$_2$CO$_2$Na | 106 | 0 |
| 18 | magnesium acetate | Mg(O$_2$CCH$_3$)$_2$ | 43 | 0 |
| 19 | sodium propionate | NaO$_2$CCH$_2$CH$_3$ | 43 | 0 |
| 20 | ammonium citrate, dibasic | NH$_4$O$_2$CCH$_2$C(OH)(CO$_2$H)CH$_2$CO$_2$NH$_4$ | 43 | 0.14 |
| 21 | sodium succinate, dibasic | NaO$_2$CCH$_2$CH$_2$CO$_2$Na | 73 | 0 |
| 22 | sodium malonate, dibasic | NaO$_2$CCH$_2$CO$_2$Na | 66 | 0 |
| 23 | sodium phosphate, dibasic | Na$_2$HPO$_4$ | 43 | 0 |
| 24 | sodium phosphate, tribasic | Na$_3$PO$_4$ | 43 | 0 |
| 25 | sodium hydroxide | NaOH | 18 | 0 |
| Comparison 3 | sodium 2,5-dihydroxybenzoate | (HO)$_2$C$_6$H$_3$CO$_2$Na | 79 | 0.60 |

As indicated by the data reported in Table II, a wide variety of basic compounds are effective in controlling thermal fog susceptibility in the lithographic printing plates of this invention. While the mechanism whereby these compounds function is not understood, it is believed that substituents with easily extractable hydrogens, such as hydroxyl groups, can in some instances interfere with the mechanism and adversely affect the antifogging activity of the basic compound. Thus, sodium 2,5-dihydroxybenzoate (Comparison 3) increased the susceptibility to thermal fogging and sodium gallate, which is sodium 3,4,5-trihydroxybenzoate, did not perform as well as many of the other basic compounds. Sodium 2,5-dihydroxybenzoate is less basic than is sodium gallate, as indicated by the reverse order of their conjugate acid strengths (pKa's of 2.97 and 4.41 respectively) and as a consequence is more susceptible to the interference posed by easily extractable hydrogens. In the present invention, stronger bases generally work better than weaker bases.

The invention has been described in detail, with particular reference to certain preferred embodiments thereof, but it should be understood that variations and modifications can be effected within the spirit and scope of the invention.

What is claimed is:

1. A process of forming a lithographic printing surface comprising the steps of:
   (I) providing a lithographic printing plate comprising a support having thereon a radiation-sensitive layer and an oxygen barrier layer; said radiation-sensitive layer comprising (1) at least one addition-polymerizable ethylenically-unsaturated compound and (2) a photopolymerization initiator system comprising (A) a spectral sensitizer that sensitizes in the ultraviolet or visible regions of the spectrum and (B) a polycarboxylic acid co-initiator, said polycarboxylic acid co-initiator comprising an aromatic moiety substituted with a hetero atom selected from nitrogen, oxygen and sulfur and comprising at least two carboxyl groups with at least one of said carboxyl groups being linked to said hetero atom; said oxygen barrier layer comprising fully hydrolyzed polyvinyl alcohol; and said lithographic printing plate comprising a basic compound, in at least one of said oxygen barrier layer and said radiation-sensitive layer, in an amount sufficient to control thermal fog susceptibility of said lithographic printing plate, said basic compound being represented by the formula:

wherein M is a cation, R is OH$^-$, PO$_4^{-3}$, HPO$_4^{-2}$, H$_2$PO$_4^-$, NO$_2^-$, NO$_3^-$, SCN$^-$, BF$_4^-$, $^-$SO$_3$R$^1$ or $^-$OOCR$^1$ wherein R$^1$ is hydrogen or a substituted or unsubstituted hydrocarbyl group; and x and y are integers such that x times the valence of M is equal to y times the valence of R,
   (II) imagewise exposing said radiation sensitive layer with an ultraviolet- or visible-light-emitting laser, and
   (III) subjecting said imagewise-exposed lithographic printing plate to development to remove the non-exposed areas of said radiation-sensitive layer and reveal the underlying support.

2. A process as claimed in claim 1, wherein said basic compound is represented by the formula:

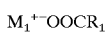

where M$_1$ is an alkali metal cation, and
   R$_1$ is an alkyl group or carboxyalkyl group.

3. The method of claim 2 wherein
   R$^1$ is a substituted or unsubstituted hydrocarbyl group of 1 to 20 carbon atoms.

4. The method of claim 2 wherein R$_1$ is an alkyl or carboxyalkyl group of 2 to 12 carbon atoms.

5. A process as claimed in claim 1, wherein said basic compound is selected from the group consisting of sodium thiocyanate, monobasic sodium tartrate, monobasic sodium citrate, potassium nitrite, sodium 3-chloropropionate, lithium benzoate, dibasic sodium tartrate, dibasic sodium fumarate, potassium sorbate, dibasic sodium citrate, magnesium acetate, sodium propionate, dibasic ammonium citrates dibasic sodium succinate, dibasic sodium malonate, dibasic sodium phosphate, tribasic sodium phosphate and sodium hydroxide.

6. A process as claimed in claim 1, wherein said laser is an argon-ion laser.

7. A process as claimed in claim 1, wherein said laser is a frequency doubled Nd:YAG laser.

8. The method of claim 1 wherein said printing plate support is comprised of grained and anodized aluminum.

9. The method of claim 1 wherein said photopolymerization initiator system additionally comprises a second co-initiator selected from the group consisting of iodonium salts, titanocenes, haloalkyl-substituted s-triazines, hexaaryl bisimidazoles, alkyltriarylborate salts and photooxidants containing a heterocyclic nitrogen atom that is substituted by either an alkoxy group or an acyloxy group.

10. The method of claim 1 wherein said spectral sensitizer is a coumarin, fluorescein, fluorone, xanthene, merocyanine, thioxanthone or isoalloxanine.

11. The method of claim 1 wherein said spectral sensitizer is a 3-substituted coumarin.

12. The method of claim 11 wherein said spectral sensitizer is a 3-ketocoumarin.

13. The method of claim 1 wherein said spectral sensitizer is a merocyanine containing a constrained alkylamino group.

14. The method of claim 1 wherein said polycarboxylic acid co-initiator is anilinediacetic acid.

15. The method of claim 1 wherein said oxygen barrier layer comprises about 0.5 to about 5 g/m$^2$ of fully hydrolyzed polyvinyl alcohol.

16. The method of claim 1 wherein said basic compound is present therein in an amount of about 0.02 to about 2 millequivalents per gram of polyvinyl alcohol.

17. A process of forming a lithographic printing surface comprising the steps of:

(I) providing a lithographic printing plate comprising a support having thereon a radiation-sensitive layer and an oxygen barrier layer; said radiation-sensitive layer comprising (1) at least one addition-polymerizable ethylenically-unsaturated compound and (2) a photopolymerization initiator system comprising (A) a spectral sensitizer that sensitizes in the ultraviolet or visible regions of the spectrum and (B) a polycarboxylic acid co-initiator, said polycarboxylic acid co-initiator comprising an aromatic moiety substituted with a hetero atom selected from nitrogen, oxygen and sulfur and comprising at least two carboxyl groups with at least one of said carboxyl groups being linked to said hetero atom; and said oxygen barrier layer comprising fully hydrolyzed polyvinyl alcohol and a basic compound in an amount sufficient to control thermal fog susceptibility of said lithographic printing plate, said basic compound being represented by the formula:

$M_xR_y$ 

wherein M is a cation, R is OH$^-$, PO$_4^{31\ 3}$, HPO$_4^{-2}$, H$_2$PO$_4^-$, NO$_2^-$, NO$_3^-$, SCN$^-$, BF$_4^-$, $^-$SO$_3$R$^1$ or $^-$OOCR$^1$ wherein R$^1$ is hydrogen or a substituted or unsubstituted hydrocarbyl group; and x and y are integers such that x times the valence of M is equal to y times the valence of R, (II) imagewise exposing said radiation sensitive layer with an ultraviolet- or visible-light-emitting laser, and (III) subjecting said imagewise-exposed lithographic printing plate to development to remove the non-exposed areas of said radiation-sensitive layer and reveal the underlying support.

18. A process as claimed in claim 17, wherein said basic compound is sodium propionate.

* * * * *